(12) United States Patent
Pawlowski et al.

(10) Patent No.: US 7,729,179 B2
(45) Date of Patent: *Jun. 1, 2010

(54) RANDOM ACCESS MEMORY EMPLOYING READ BEFORE WRITE FOR RESISTANCE STABILIZATION

(75) Inventors: J. Thomas Pawlowski, Boise, ID (US); Patricia C. Elkins, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/371,856

(22) Filed: Feb. 16, 2009

(65) Prior Publication Data

US 2009/0154228 A1 Jun. 18, 2009

Related U.S. Application Data

(63) Continuation of application No. 11/468,997, filed on Aug. 31, 2006, now Pat. No. 7,505,330.

(51) Int. Cl.
*G11C 7/10* (2006.01)

(52) U.S. Cl. .......................... 365/189.05; 365/189.011; 365/163

(58) Field of Classification Search ............ 365/189.05, 365/189.011, 163
See application file for complete search history.

(56) References Cited

U.S. PATENT DOCUMENTS

| | | | |
|---|---|---|---|
| 6,111,801 A | 8/2000 | Brady | |
| 7,126,847 B2 * | 10/2006 | Ha et al. | 365/163 |
| 7,349,245 B2 * | 3/2008 | Kim et al. | 365/158 |
| 7,359,231 B2 | 4/2008 | Venkataraman et al. | |
| 7,362,608 B2 | 4/2008 | Schwerin et al. | |
| 7,505,330 B2 * | 3/2009 | Pawlowski et al. | 365/189.05 |
| 2003/0198118 A1 | 10/2003 | Lowery | |

(Continued)

OTHER PUBLICATIONS

S.H. Lee et al., "Full Integration and Cell Characteristics for 64Mb Nonvolatile PRAM," 2004 Symp. On VLSI Technology Digest of Technical Papers, pp. 20-21 (2004).

(Continued)

*Primary Examiner*—Son Dinh
*Assistant Examiner*—Nam Nguyen
(74) *Attorney, Agent, or Firm*—Wong, Cabello, Lutsch, Rutherford & Brucculeri, LLP

(57) ABSTRACT

An improved architecture and method for operating a PCRAM integrated circuit is disclosed which seeks to minimize degradation in the resistance of the phase change material in the cells. When an attempt is made during a write command to write a data state to a bit which already has that data state, such matching data states are identified and writing to those bits is precluded during the write command. In one embodiment, both the incoming data to be written to a bit and the data currently present at that bit address are latched. These latched data are then compared (e.g., with an XOR gate) to determine which bits have a matching data state. The results of this comparison are used as an enable signal to the write (column) driver in the PCRAM memory array, with the effect that only data bits having different data state are written, while data bits having a matching data state are not needlessly re-written. Because matching data states are ignored, reliability problems associated with such redundant writing are alleviated, and power is saved.

24 Claims, 7 Drawing Sheets

U.S. PATENT DOCUMENTS

2004/0225829 A1   11/2004   Akiyama et al.
2006/0034142 A1    2/2006   Ooishi et al.

OTHER PUBLICATIONS

S. Hudgens and B. Johnson, "Overview of Phase-Change Chalcogenide Nonvolatile Memory Technology," MRS Bulletin, pp. 829-832 (Nov. 2004).

F. Yeung et al., "Ge2Sb2Te5 Confined Structures and Integration of 64 Mb Phase-Change Random Access Memory," Japanese Journal of Applied Physics, vol. 44, No. 4B, pp. 2691-2695 (2005).

Y.N. Hwang et al., "Full Integration and Reliability Evaluation of Phase-change RAM Based on 0.24um-CMOS Technologies," 2003 Symposium on VLSI Technology Digest of Technical Papers, pp. 173-147 (2003).

W.Y. Cho, et al., "A 0.18-um 3.0-V 64-Mb Nonvolatile Phase-Transition Random Access Memory (PRAM)," IEEE Journal of Solid-State Circuits, vol. 40, No. 1, pp. 293-300 (Jan. 2005).

F. Bedeschi, et al., "An 8Mb Demonstrator for High-Density 1.8V Phase-Change Memories," 2004 Symposium on VLSI Circuits Digest of Technical Papers, pp. 442-445 (2004).

\* cited by examiner

RANDOM ACCESS MEMORY EMPLOYING READ BEFORE WRITE FOR RESISTANCE STABILIZATION

CROSS REFERENCE TO RELATED APPLICATIONS

This application is a continuation of U.S. patent application Ser. No. 11/468,997, filed Aug. 31, 2006, to which priority is claimed, and which is incorporated herein by reference in its entirety.

FIELD OF THE INVENTION

Embodiments of the invention relate to an improved write path architecture particularly useful in a phase change random access memory.

BACKGROUND

Semiconductor memory integrated circuits are in high demand, and the industry is always striving to improve the density of such devices. Currently, the Dynamic Random Access Memory (DRAM) is in widespread use. However, DRAM cells require a capacitor, which requires refreshing to preserve the stored data.

Accordingly, newer memory cell technologies are under consideration for the mass market. One such new memory technology is the Phase Change Random Access Memory (PCRAM). In a PCRAM, the capacitor of the DRAM cell is replaced with a phase change material, such as Germanium-Antimony-Telluride (GST) or other chalcogenide materials. An example of such a cell 30 as fabricated is shown in cross section in FIG. 1B, and is shown in schematic form in FIG. 1A. Because the structure and operation of PCRAMs are well known to those skilled in the art, they are only briefly described. The PCRAM cell is an exciting alternative to traditional capacitor-based DRAM cells because they do not require refresh and are easily scalable. (Capacitors require a given surface area to store the requisite number of charges, and hence are not easily scaled).

As shown, each PCRAM cell 30 comprises an access transistor 32 and a phase change material 34. Each access transistor 32 is selectable via a word line (row) 20, which when accessed opens a transistor channel between a bit line (column) 24 and a reference line 22. The phase change material 34 is in series between the transistor channel and the cell selection line 24, and so can be set (i.e., programmed to a logic '1' state), reset (i.e., erased to a logic '0' state), or read via the passage of current through the material. As is well known, phase change material 34 can be set by passing a current therethrough, which modifies the material into a more conductive crystalline state (e.g., less than 10K ohms). This phase change of the material 34 is reversible, and so the material 34 may be reset back to an amorphous resistive state (e.g., more than 500K ohms) by the passage of even a larger amount of current through the material. Such phase changing occurs in the region 34a adjacent to the bottom electrode 42b as shown in FIG. 1B. Once set or reset to make the material 34 relatively conductive (denoting storage of a logic '1') or resistive (denoting storage of a logic '0'), the cell may be read by passing a relatively small current through the phase change material 34 and sensing the resulting voltage on the bit lines 24.

Processing of the PCRAM cell 30 uses standard semiconductor CMOS processing techniques, and does not require significant explanation to those of skill in the art. As shown in FIGS. 1B and 1C, the cell 30 uses polysilicon gate for the word lines 20 as is common, and uses conductive plugs to contact the diffusion regions 44 in active portions of the silicon substrate. The phase change material 34 is sandwiched between top and bottom electrodes 42a and 42b. Contact from the bit line 24 to top electrodes 42a is established by plugs 40. Of course, conductive structures are surrounded by at least one dielectric material 35, such as silicon dioxide or silicon nitride as is well known. Pairs of adjacent cells 30 are isolated from one another using trench isolation 46, again a standard technique for isolating active structure in a silicon substrate.

Other details concerning PCRAM memory composition, operation, and fabrication can be found in the following references, all of which are incorporated by reference herein in their entireties: S. H. Lee et al., "Full Integration and Cell Characteristics for 64 Mb Nonvolatile PRAM," 2004 Symp. on VLSI Technology Digest of Technical Papers, pps. 20-21 (2004); S. Hudgens and B. Johnson, "Overview of Phase-Change Chalcogenide Nonvolatile Memory Technology," MRS Bulletin, pps. 829-832 (November 2004); F. Yeung et al., "$Ge_2Sb_2Te_5$ Confined Structures and Integration of 64 Mb Phase-Change Random Access Memory," Japanese Journal of Applied Physics, Vol. 44, No. 4B, pps. 2691-2695 (2005); Y. N. Hwang et al., "Full Integration and Reliability Evaluation of Phase-change RAM Based on 0.24 um-CMOS Technologies," 2003 Symposium on VLSI Technology Digest of Technical Papers, pps. 173-147 (2003); W. Y. Cho, et al., "A 0.18-um 3.0-V 64-Mb Nonvolatile Phase-Transition Random Access Memory (PRAM)," IEEE Journal of Solid-State Circuits, Vol. 40, No. 1, pps. 293-300 (January 2005); and F. Bedeschi, et al., "An 8 Mb Demonstrator for High-Density 1.8V Phase-Change Memories," 2004 Symposium on VLSI Circuits Digest of Technical Papers, pps. 442-445 (2004).

The array 10 of PCRAM cells 30 can be operated as follows. First, a cell 30 to be accessed is determined by the logic of the integrated circuitry in which the array is formed (not shown), and an appropriate word line 20 and bit line 24 are respectively activated via row decoder/driver circuitry 12 and column decoder/driver circuitry 14. The reference drivers 16 send a reference potential to each of the cells 30 in the array 10 at all times, which can be ground for example. An activated word line 20 can comprise a voltage sufficient to form a channel under the access transistors, e.g., 1.5V. The voltage to be placed on the selected bit line 24 depends on whether the accessed cell is being set, reset, or read. When the cell is being set, the voltage on the bit line might be approximately 2.0V, and when reset a higher voltage of perhaps 3.0V can be used. When the cell is being read, a smaller bit line 24 voltage is used (e.g., 0.5V), and the current draw through the bit line is assessed via sense amplifiers (not shown) in the column decoder/driver circuitry 14. Because such decoder/driver circuitry 12, 14, 16 is well known, it is not further discussed.

It has been discovered that PCRAM cells can suffer from reliability problems. For example, the performance of a cell can eventually degrade as the cell is continually set or reset. For example, FIG. 2 shows exemplary performance of a cell which is continually erased to a logic '0' reset condition through the application of high current. As can be seen from the graph, initially, the resistivity of the cell behaves well, and the phase change material 34 exhibits a high resistance of about 500K ohms. However, as the cell is continually erased (without any intervening programming to a logic '1' set condition), eventually the resistance of the cell starts to degrade, perhaps to 200K ohms after 1000 erase cycles. Of course, this is not optimum, because as the resistivity of the logic '0' erased bits starts to fall, the sensing margin between the logic '0' erased bits and the logic '1' programmed bits begins to degrade, with the result that sensing of the logic state of the bit becomes more uncertain, or slower, or generally becomes more unreliable.

This problem is not merely academic, but can have a real impact in a commercially-marketable PCRAM integrated circuit. While cells in a PCRAM integrated circuit can be freely set (logic '1') or reset (logic '0'), they typically are done so on a byte or word basis. Take for example a PCRAM integrated circuit which is byte (8-bit) programmable. A given address in the PCRAM might currently be programmed with a given byte, say '01111111' for example. It might be desired to change the data stored at this address to make the least-significant bit a logic '0'; in other words, it might be desired that the byte at the address be updated to '01111110'. To effectuate such a change to the data at this address, it is generally not efficient to design the circuitry so as to only reset the least-significant bit to a logical '0'. Instead, preferably, the entire byte of data is reprogrammed at the address, i.e., '01111110' is programmed at the address location. Of course, this means that the data state of some of the cells in the byte may not actually be changed. For example, the most-significant bit '0' remains unchanged in this example, and so is redundantly reset with a high current.

But as just noted, such continual resetting of this most-significant bit will eventually degrade the resistivity of the phase change material in that bit. To continue the example above, supposed that the address is continually programmed back and forth with the logic states '01111111' and '01111110'. The effect of this hypothetical is that the most-significant bit will be continually reset with a high current to the logic '0' state, which as FIG. 2 notes, will eventually degrade its performance. As the resistivity of the various logic '0' states across an array of PCRAM bits eventually becomes more dispersive as bits are more or less affected by this phenomenon, eventually overall reliability of the PCRAM integrated circuit will suffer.

Although not illustrated in FIG. 2, it has been noted that a similar degradation exists in continually setting a logic '1' to the same bit (without any intervening reset to a logic '0' state). Thus, if a bit is continually set to a logic '1' state, its resistively, normally about 10K ohms, will eventually start to increase as a function of the number of cycles. Although such degradation has not been noticed to be as stark for the logic '1' case versus the logic '0' case, the inadvertent increase of the resistivity of the logic '1' bits also degrades the sensing margin between a logic '0' and a logic '1,' and similarly tends to decrease the reliability of the PCRAM integrated circuit.

A solution to this problem is therefore desirable, and is provided in this disclosure.

BRIEF DESCRIPTION OF THE DRAWINGS

Embodiments of the inventive aspects of this disclosure will be best understood with reference to the following detailed description, when read in conjunction with the accompanying drawings, in which.

DETAILED DESCRIPTION

An improved architecture and method for operating a PCRAM integrated circuit is disclosed which seeks to minimize degradation in the resistance of the phase change material in the cells. Because such degradation is most prevalent when an attempt is made during a write command to write a data state to a bit which already has that data state (a matching data state), such matching data states are identified and writing to those bits is precluded during the write command. In one embodiment, identification of matching data state occurs automatically inside of the processing of the write commands, and as such the device requesting the write need not otherwise format the write command in any non-standard way.

In such an embodiment, the issuance of a write command to a particular address (e.g., a particular byte) first latches the incoming data to be written. Then, the data currently present at that address is read, and is also latched. The latched incoming data and the latched current data are then compared on a bit-by-bit basis (e.g., with XOR gates) to determine which bits have a matching data states. The results of this comparison are used as an enable signal to the write driver in the PCRAM memory array, with the effect that only data bits having different data state are written, while data bits having a matching data state are not needlessly re-written. Because matching data state are ignored, reliability problems associated with such redundant writing as highlighted above are alleviated. Moreover, further benefits result in the form of power savings, because extra current is not required due to the decision to forgo writing to the disabled, matching-data-state bits.

Figure 1A:
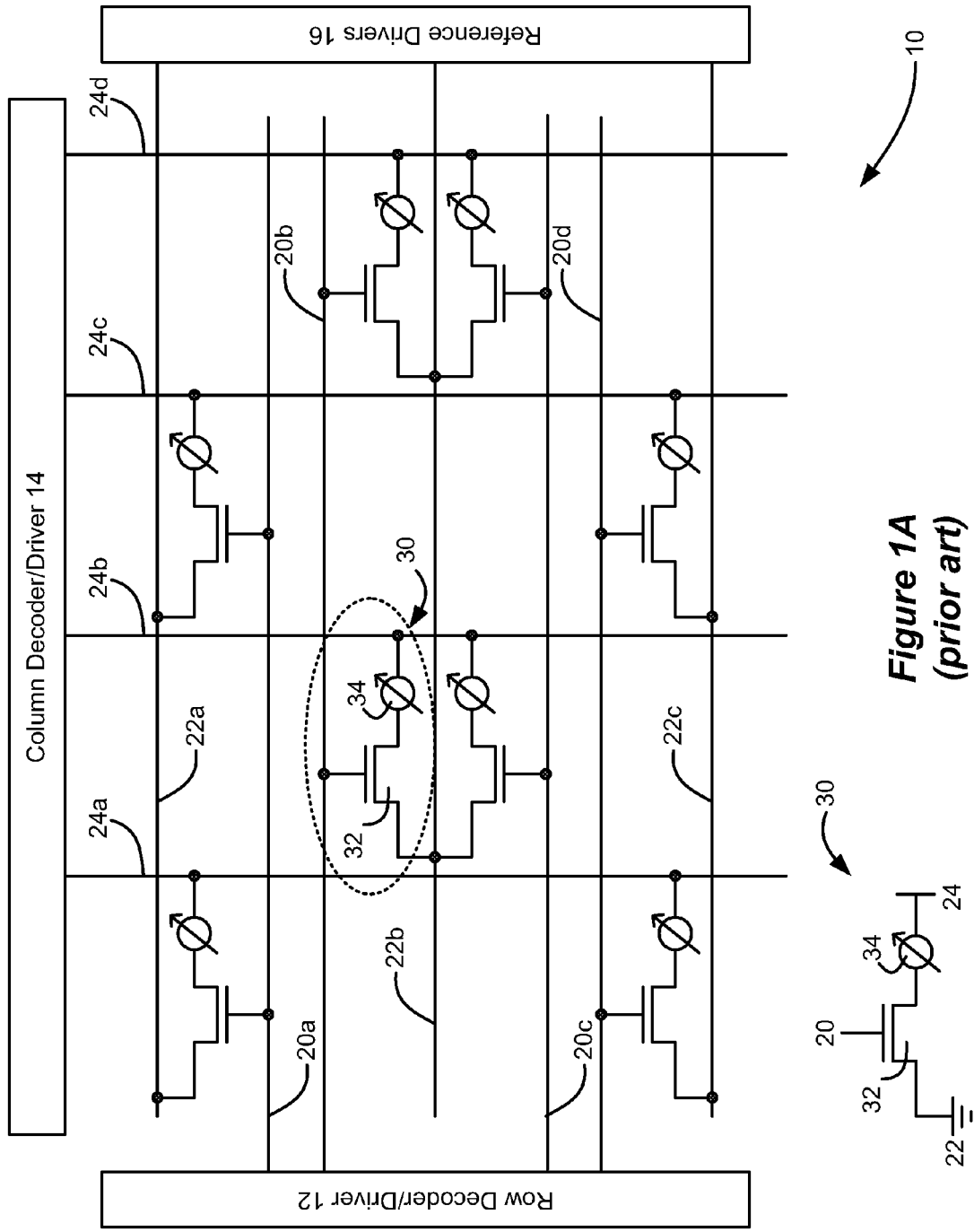
FIGS. 1A, 1B, and 1C illustrate a prior art design for a PCRAM memory array, and respectively show the array in schematic, cross sectional, and layout views.
Figure 1B:
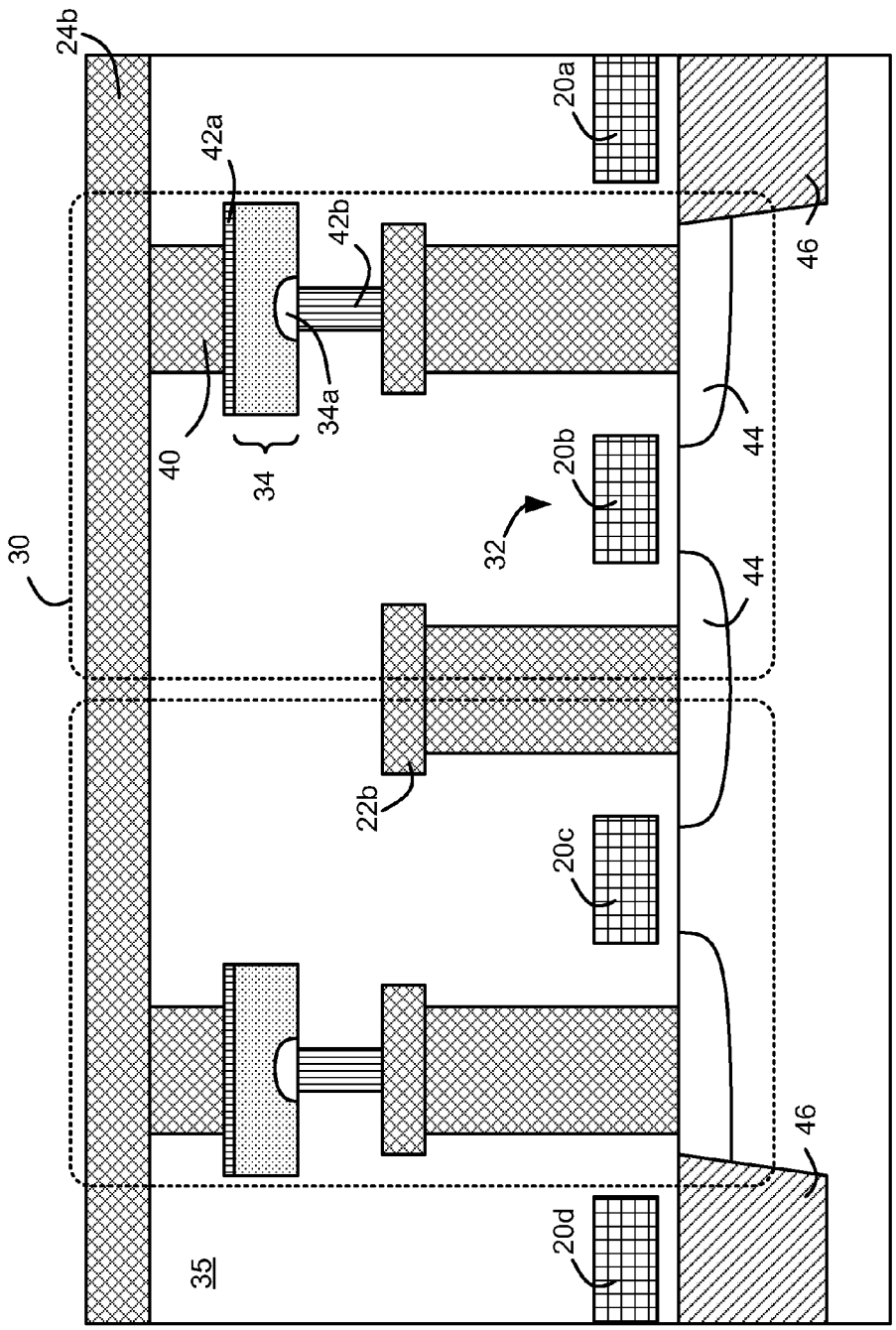
Figure 1C:
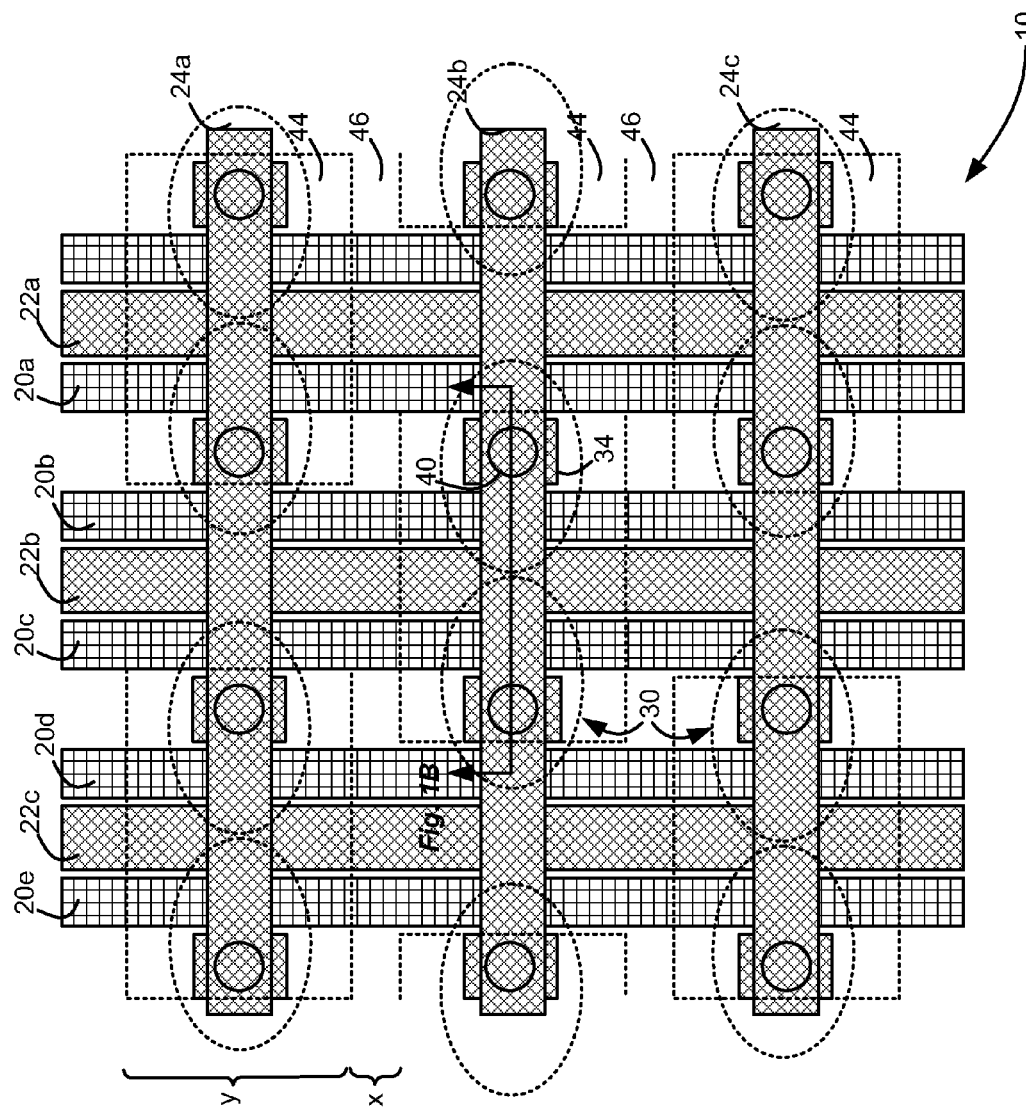
Figure 2:
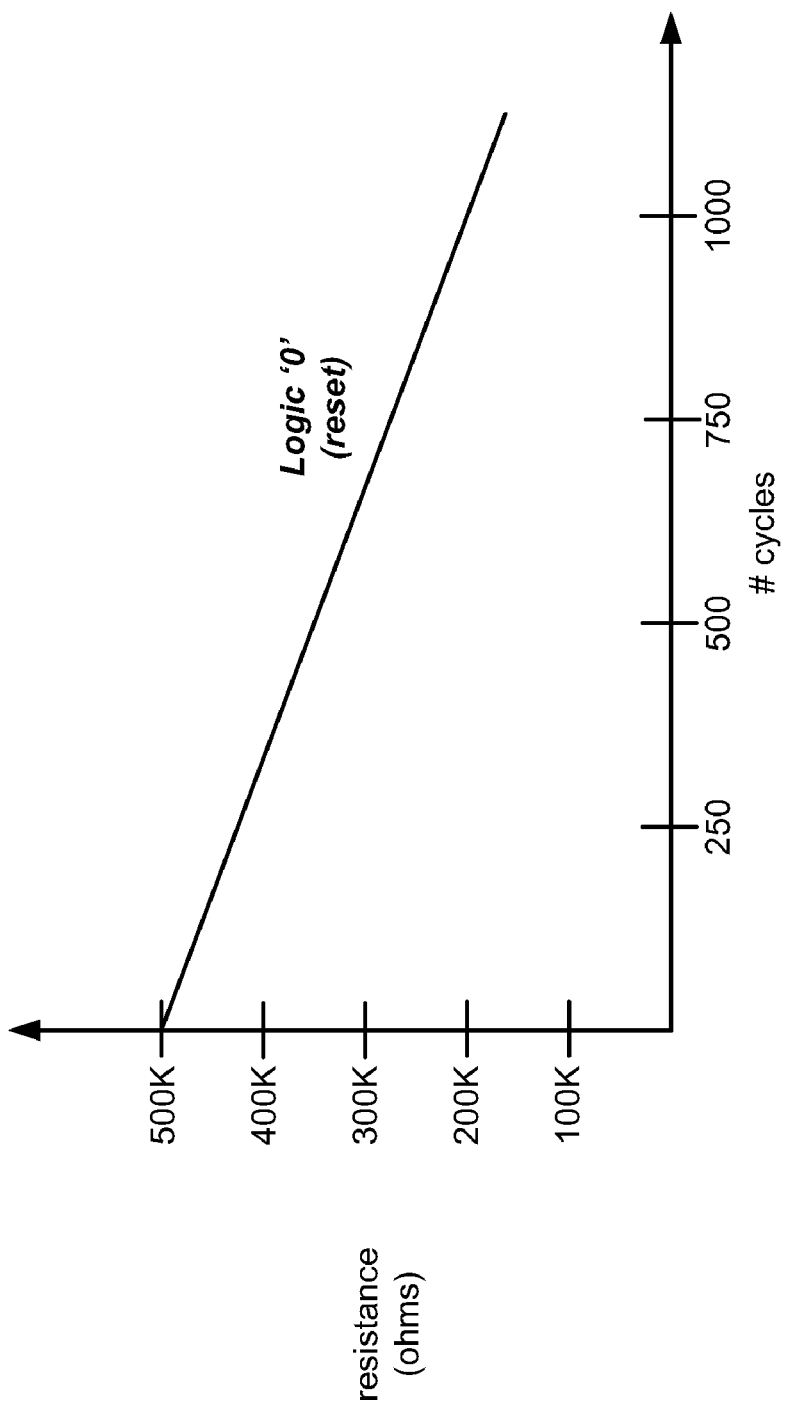
FIG. 2 illustrate degradation in the performance of a PCRAM bit continually reset to a logic '0' state.
Figure 3:
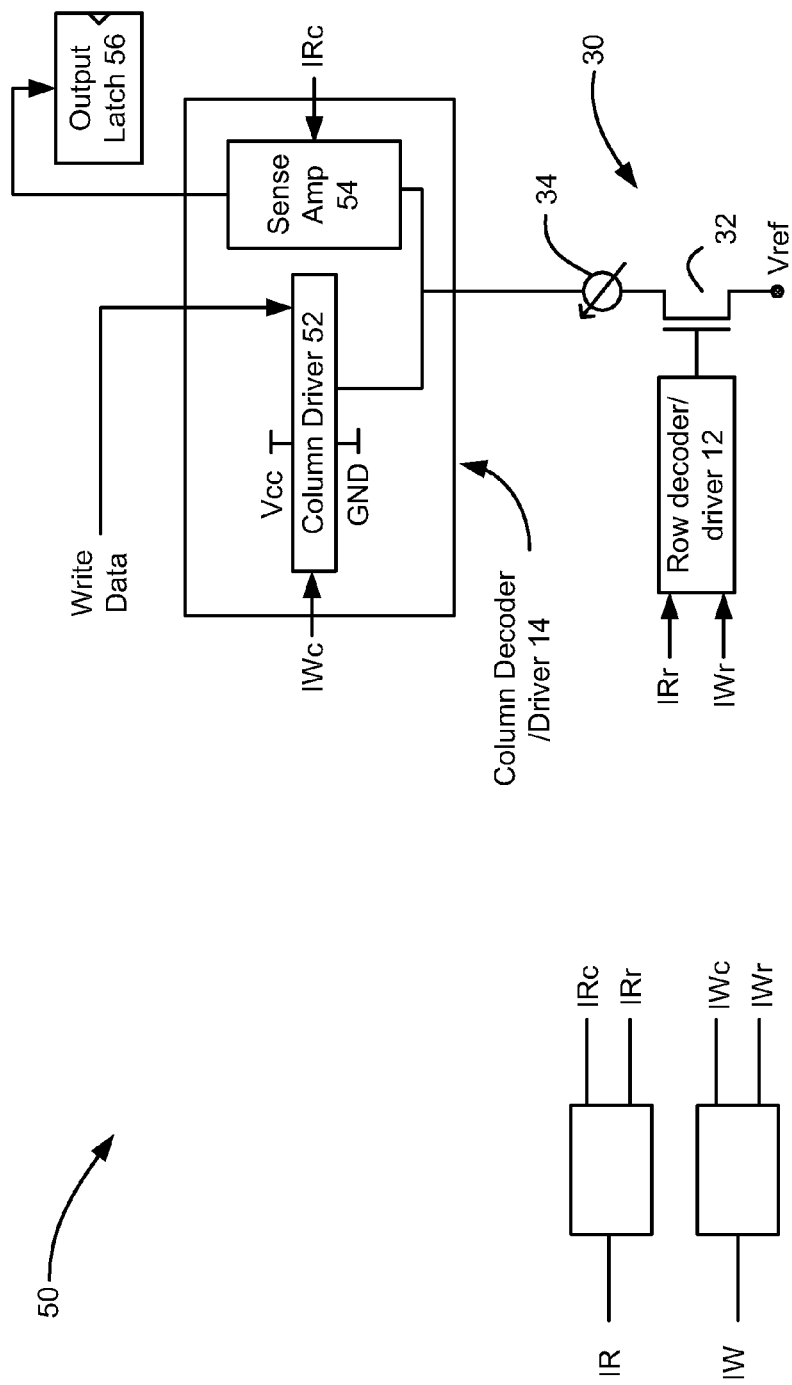
FIG. 3 illustrates the write path circuitry of a PCRAM according to the prior art.
Figure 4:
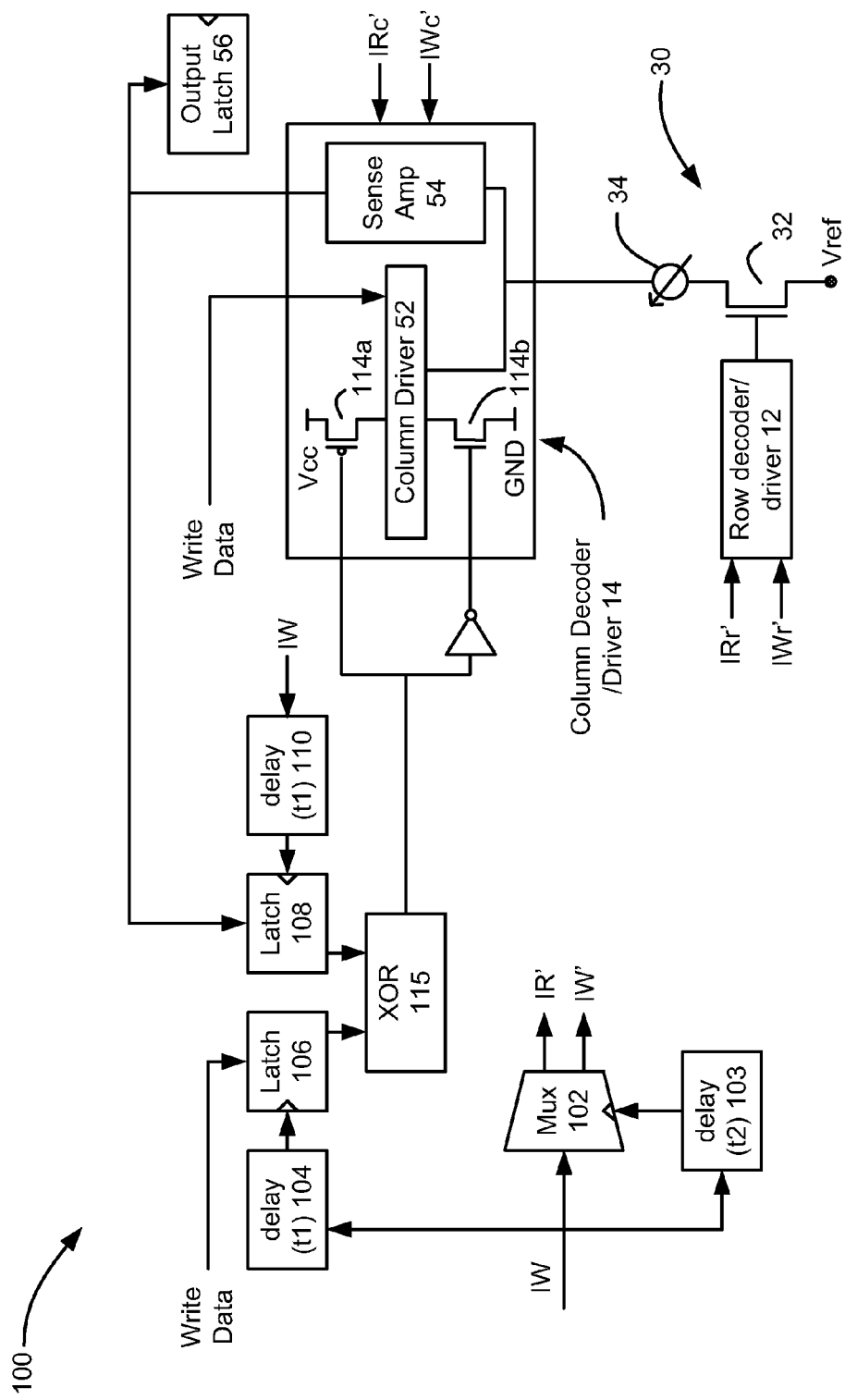
FIG. 4 illustrates the write path circuitry of a PCRAM according to an embodiment of the invention.

FIG. 4 shows exemplary write path architecture that achieves this result. However, to best understand aspects of the inventive embodiment of FIG. 4, FIG. 3, which discloses the write path 50 of a PCRAM in accordance with the prior art, is first discussed. It will be appreciated that the write path 50 as illustrated is for a single bit in the array. In a real commercial embodiment, this write path circuitry would in relevant part be multiplied by the data width of the device (×8, ×16, etc.). However, this redundancy in the write path circuitry is not shown for simplicity.

A traditional PCRAM integrated circuit (like other RAM integrated circuits) is capable of being written to (i.e., set or reset) or read. Whether the device is being written to or read is typically determined in accordance with one or more control signals (not shown) applied externally to the device. Such control signal(s) are internally decoded, and ultimately cause an internal write (IW) or internal read (IR) to be issued, as shown in FIG. 3. Such internal commands are in turn used to derive signals specific to writing to or reading from the columns or rows of the array of cells. Thus, from internal commands IW and IR, commands IWr and IRr can be derived, which ultimately are received by the row decoder/drivers 12 of the row specified by the address in question. Likewise, commands IWc and IRc can be derived for controlling the column specified by the address. Typically, IRc is input to the sense amplifier 54 at the end of the column as a control for sensing the current or voltage on the column during a read operation. IWc on the other hand activates the column driver 52 of the selected column during a write operation, and in conjunction with the write data, provides a suitable voltage (a logic '1' or logic '0') to the column for uptake at the cell. Derivation of control signals IR and IW, and their derivative signals IRx and IWx, are well known in the art.

With this basic understanding of the write path with the PCRAM understood, attention now turns to an embodiment of the invention in FIG. 4, which illustrates an improved write path 100. As shown, additional circuitry is provided to the otherwise standard write path of FIG. 3, with the goal that such circuitry effectuates a read and compare internal to the write command, IW. Before discussion of the details of this write path 100 circuitry, it should be understood that circuitry to effectuate the goals of this disclosure can be configured in several different ways, and that state machine approaches could also be used. This illustrated circuitry therefore is merely exemplary and could very well be different in a commercial embodiment, as one skilled in the art would understand.

As shown in FIG. 4, the internal write command IW as decoded first meets with a multiplexer (mux) 102. The mux 102 passes the IW write command either onto a derivative internal write signal IW' or a derivative internal read signal IR', depending on the status of the mux's control terminal. In this embodiment, the control terminal of mux 102 comprises a delayed assertion of the internal write command IW, as provided by a delay element 103. The effect is that the mux 102 initially asserts derivative internal read command IR' when the internal write command IW is asserted, and then after the delay period (t2), asserts the derivative internal write command IW'. These derivative internal signals IW' and IR' are essentially no different from the signals IW and IR as illustrated and discussed with respect to FIG. 3; that is, signals IR' and IW' are ultimately used to derive derivative signals IWx' and IRx' which control the writing to and reading from the rows and columns of the array.

The effect of such circuitry is that the assertion of an internal write command IW will first place the PCRAM into a read state (via assertion of IR'), and then later place the device into the intended write state (IW') after a specified period of delay (t2). Of course, the period of delay (t2) should be chosen to allow time for the reading of the data already present at the address, before writing of the write data actually occurs.

Because the address at which the write data is to be written has already been latched (not shown), the data already present at that address can be easily read via assertion of the derivative internal read command IR' (and its associated derivative signals IRr' and IRc'). Thus, the data present in the cell 30 is read via sense amp 54. However, instead of being latched in the normal output latch 56 used to send data to the output of the device, a special latch 108 is used. This latch 108 is (like mux 102) controlled by a delayed assertion of the internal write command IW, i.e., as delayed by a time t1. The idea here is after the assertion of the internal write command IW to read and latch the data already present at the specified write address. Of course, the delay t1 should be chosen to allow sufficient time to read the data at the location upon assertion of the internal write command (which, again, is converted to derivative internal read command IR' at the mux 102). Moreover, because delay t2 comprises the time at which reading is shifted to writing, delay t1 should be less than t2 to ensure that the data is properly read before writing begins.

Despite the fact that the bit as illustrated is initially being read, it bears remembering that ultimately the job of the write path 100 is to write (if necessary) the write data into the specified cell 30. Accordingly, the write data is provided to the column driver 52 circuitry as is normal. However, in the illustrated embodiments, the write data is also latched in a latch 106, which like latch 108 for the read data, is controlled by a delayed assertion of the internal write command IW. In a preferred embodiment, the write data can be latched with the same delay (t1) as is the read data such that the two are latched simultaneously. But this is not strictly necessary, especially when it is considered that the write data might have already been latched earlier in the writing process. (In fact, latch 106 can comprise an otherwise standard write path latch).

Regardless, the latched versions of the write data (to be written to the specified address) and the read data (as initially read from the specified address) are compared at an exclusive OR (XOR) gate 115. The output of the XOR gate 115 (which can itself be latched; not shown) thus comprises a comparison of the write and read data, issuing a logic '1' if the states match and a logic '0' if they don't.

The result of this comparison is in turn sent to the column driver 52 circuitry, and more specifically to write enable transistors 114a and 114b. The write enable transistors 114a and 114b are coupled to the power supply voltages (Vcc; GND) as shown, and have the ability to either isolate (i.e., disable) or allow (i.e., enable) power to be provided to the column driver 52. That is to say, when enabled, the column driver 52 receives power, and will be able to drive the column to write to the specified bit address in accordance with the specified write data; when disabled, the column driver 52 is tri-stated, i.e., disconnected from the power supply voltages, and the column driver 52 will be unable to permit the write data from effecting the column. In other words, when the comparison as performed by the XOR gate 115 is true, writing occurs as normal; when false, writing is prohibited at the specified bit.

Figure 5:
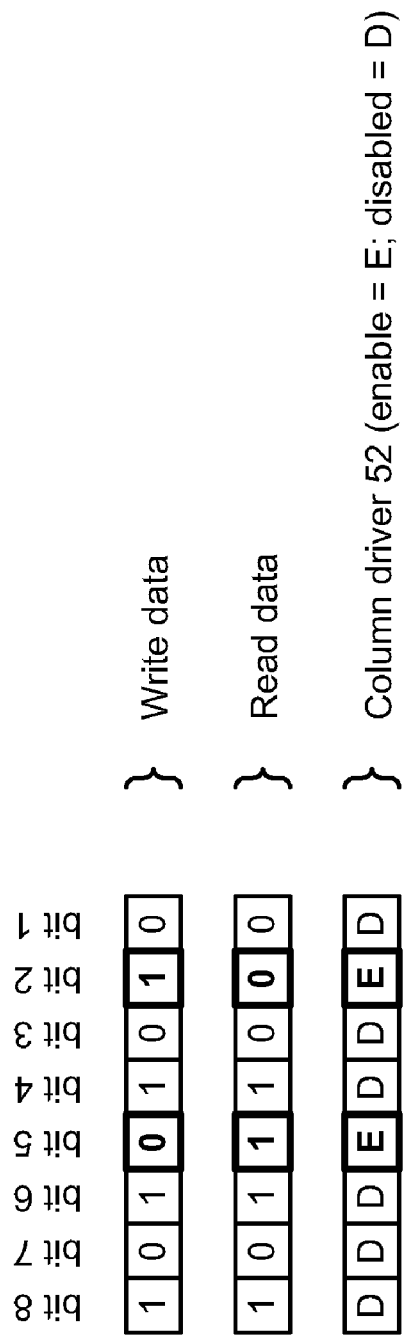
FIG. 5 illustrates an example of how the write path circuitry of FIG. 4 operates when programming a single byte, and shows the selective enablement of the write drivers for only those bits in the byte that are different from their currently programmed values.

As noted earlier, the illustrated write path circuitry 100 illustrates the write path of a single bit, but in a conventional PCRAM device such circuitry can be duplicated in accordance with the data width of the device (×8, ×16, etc.). The overall effect of implementation of the write path circuit is a bit-by-bit comparison between each bit in the write data and the data as read from the device, and selective writing only for those bits that are different. For example, consider a PCRAM device with a data width of 8 bits, i.e., which reads and writes bytes of data, as is illustrated in FIG. 5. Shown is the write data to be written at a particular addressed byte ('10101010'). Also shown is the read data that is currently present at that address ('10111000'), which is confirmed during the initial reading portion of the write cycle as discussed above. These bytes of data are compared on a bit-for-bit basis using the XOR gate 115 as discussed above and other related circuitry, with the result being that only bits 5 and 2 in the byte comprising bits 8 through 1 are different. When using the write path circuitry 100 of FIG. 4, the result is the selectively enabling ('E') of the column drivers 52 for bits 5 and 2. The column drivers 52 for all other matching bits are disabled ('D').

When the improved write path circuitry 100 as illustrated above is used in a PCRAM integrated circuit, reliability problems discussed earlier are mitigated. Because bits are not re-written when they do not need to be, i.e., when the write data matches the already-present read data, degradation in the data states (especially logic '0' reset data state) is prevented. Moreover, as an additional bonus, power is saved when bits not needing a change of data state are disabled from being programmed. Moreover, the disclosed write path circuitry does not require significant additional layout to an otherwise traditional PCRAM device.

Implementation of the disclosed write path circuitry 100 has the potential to increase the cycle time necessary for a write to the array, as the additional time needed for the initial read and comparison must be accounted for. However, because reading is relatively fast when compared to the writing (e.g., 10 ns v. 50 ns), such increase in cycle time can be insignificant. Should concerns regarding an increase in cycle time be significant, in other embodiments, the initial read and compare aspects of the write path circuitry 100 can be selectively enabled or disabled, thus trading off reliability for speed.

While illustrated in the context of a PCRAM integrated circuit, it should be understood that the write path scheme as disclosed herein can be used in other types of memory integrated circuits as well. Use of the disclosed techniques would be especially appropriate for those memory integrated circuits having the same types of degradation mechanisms discussed herein.

Moreover, while disclosed in the context of an integrated circuit having multi-bit addresses, the invention could also be implemented in a device having a data width of one, such that each address has only one unique bit.

While a preferred embodiment of the invention has been disclosed, it should be understood the circuitry as disclosed herein can be modified while still achieving the various advantages discussed herein. In short, it should be understood that the inventive concepts disclosed herein are capable of many modifications. To the extent such modifications fall within the scope of the appended claims and their equivalents, they are intended to be covered by this patent.

What is claimed is:

1. A method for writing write data to a memory cell in an integrated circuit, comprising:
   receiving a write command to write the write data at the memory cell;
   reading the read data currently present at the memory cell;
   comparing the write data and the read data to determine if they are of differing data states; and
   enabling a write driver to write the write data at the memory cell only if the write data and read data are of different data states.

2. The method of claim 1, memory cell comprises a phase change memory element.

3. The method of claim 2, wherein the phase change memory element comprises a chalcogenide material.

4. The method of claim 1, wherein the write driver comprises a column driver for a column coupled to the memory cell.

5. The method of claim 1, wherein comparing the data to determine bits having different states comprises using XOR or XNOR gates.

6. The method of claim 1, wherein the read data is read in response to the write command.

7. A method for writing write data to a memory cell in an integrated circuit, comprising:
   receiving at the integrated circuit write data to be written at the memory cell;
   comparing the write data to the data already present at the memory cell to determine if they are of differing data states; and
   writing the write data at the memory cell only if the write data and the data already present at the memory cell have differing data states.

8. The method of claim 7, wherein writing the write data at the memory cell comprises enabling a write driver for the memory cell.

9. The method of claim 8, wherein enabling a write driver comprises connection of the write driver to power supply voltages.

10. The method of claim 7, memory cell comprises a phase change memory element.

11. The method of claim 10, wherein the phase change memory element comprises a chalcogenide material.

12. A method for writing to an address in an integrated circuit, comprising:
    receiving a write command to write write data to an address;
    processing the write command to create a read signal and a write signal;
    using the read signal to read read data at the address;
    comparing bits in the write data and the read data to determine bits having differing data states; and
    using the write signal to write at the address only those bits having differing data states.

13. The method of claim 12, wherein the read signal is followed by the write signal.

14. The method of claim 12, wherein writing to only those bits in the multi-bit write data having differing data states comprises only enabling write drivers of those bits having different data states.

15. The method of claim 12, wherein the write data and the read data are multi-bit.

16. The method of claim 12, wherein the write data and the read data are single-bit.

17. An integrated circuit, comprising:
    write path circuitry for performing a comparison on write data to be written at an address and data currently present at the address; and
    at least one driver for writing the write data at the address, wherein the at least one driver is selectively enabled depending on the comparison.

18. The integrated circuit of claim 17, wherein the data currently present at the address is read upon issuance of a write command for the write data.

19. The integrated circuit of claim 17, wherein the write path circuitry comprises first and second latches for holding the write data and the data currently present at the address.

20. The integrated circuit of claim 17, wherein selective enablement comprises selective disconnection of the at least one driver from power supply voltages.

21. The integrated circuit of claim 17, wherein the address comprises at least one memory cell with a phase change memory element.

22. The integrated circuit of claim 17, wherein the write path circuitry comprises at least one XOR or XNOR gate for comparing write data to be written at the address and data currently present at the address.

23. The integrated circuit of claim 17, wherein the write data and the read data are multi-bit, and wherein there is a driver corresponding to each bit.

24. The integrated circuit of claim 17, wherein the write data and the read data are single-bit.

* * * * *